(12) United States Patent
Kwak

(10) Patent No.: US 10,985,307 B2
(45) Date of Patent: Apr. 20, 2021

(54) CRYOGENIC TRANSMITTER

(71) Applicant: SK hynix Inc., Gyeonggi-do (KR)

(72) Inventor: Kang-Sub Kwak, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/597,542

(22) Filed: Oct. 9, 2019

(65) Prior Publication Data

US 2020/0194655 A1 Jun. 18, 2020

(30) Foreign Application Priority Data

Dec. 12, 2018 (KR) .................. 10-2018-0159843

(51) Int. Cl.
| | |
|---|---|
| *H03K 17/92* | (2006.01) |
| *H01L 39/10* | (2006.01) |
| *H03K 3/38* | (2006.01) |
| *H01L 39/22* | (2006.01) |
| *H01L 39/16* | (2006.01) |
| *H01L 39/02* | (2006.01) |

(52) U.S. Cl.
CPC ............ *H01L 39/10* (2013.01); *H01L 39/025* (2013.01); *H01L 39/16* (2013.01); *H01L 39/223* (2013.01); *H03K 3/38* (2013.01); *H03K 17/92* (2013.01); *H03K 2217/0054* (2013.01)

(58) Field of Classification Search
CPC ....... H01L 2924/00; H01L 2924/00014; H01L 2924/0002; H01L 2924/48091; H01L 2924/3011; H03K 3/38; H03K 2217/0054; H03K 17/145; H03K 17/92
See application file for complete search history.

(56) References Cited

U.S. PATENT DOCUMENTS

| | | | |
|---|---|---|---|
| 7,898,358 B2 * | 3/2011 | Tsukahara ................. | H01P 1/15 333/101 |
| 2015/0171829 A1 * | 6/2015 | Song .................. | H03K 19/0185 327/387 |
| 2017/0324019 A1 | 11/2017 | Ware et al. | |

FOREIGN PATENT DOCUMENTS

KR 10-2017-0005291 1/2017

* cited by examiner

*Primary Examiner* — Sibin Chen
(74) *Attorney, Agent, or Firm* — IP & T Group LLP

(57) ABSTRACT

A semiconductor device includes a transmission circuit coupled between a first voltage supply node and a second voltage supply node, and suitable for outputting an output data signal corresponding to a data value to an output terminal during a data output enable period, and a switching circuit coupled between the first and second voltage supply nodes, and suitable for providing a current path between the first and second voltage supply nodes during a data output disable period.

17 Claims, 6 Drawing Sheets

CRYOGENIC TRANSMITTER

CROSS-REFERENCE TO RELATED APPLICATION

This application claims priority under 35 U.S.C. § 119 to Korean Patent Application No. 10-2018-0159843, filed on Dec. 12, 2018, the disclosure of which is incorporated herein by reference in its entirety.

BACKGROUND

1. Field

Various embodiments relate to a semiconductor design technique, and more particularly, to a cryogenic transmitter.

2. Description of the Related Art

The related art, i.e., US Patent Publication No. US 2017-0324019, includes a transmitter using Josephson junctions. The transmitter in accordance with the related art effectively transmits a signal in a cryogenic environment by utilizing hysteresis characteristics of the Josephson junctions.

However, the transmitter in accordance with the related art has the following concerns.

In the transmitter in accordance with the related art, supply voltages supplied to the transmitter are varied to adjust a current flowing in the Josephson junctions. Typically, in order to stabilize levels of supply voltages, decoupling capacitors are coupled to supply voltage terminals. Therefore, a large amount of time is required due to a resistive capacitive (RC) delay when levels of the supply voltages are varied, and large power consumption is required due to a charging/discharging operation of the decoupling capacitors.

SUMMARY

Various embodiments of the present invention are directed to a semiconductor device including a low-power and high-speed cryogenic transmitter.

In accordance with an embodiment, a semiconductor device includes: a transmission circuit coupled between a first voltage supply node and a second voltage supply node, and suitable for outputting an output data signal corresponding to a data value to an output terminal during a data output enable period; and a switching circuit coupled between the first and second voltage supply nodes, and suitable for providing a current path between the first and second voltage supply nodes during a data output disable period.

The switching circuit electrically may separate the first voltage supply node from the second voltage supply node during the data output enable period, and electrically couple the first voltage supply node to the second voltage supply node during the data output disable period.

The semiconductor device may further include: a first variable resistance element coupled between a first voltage supply terminal and the first voltage supply node; and a second variable resistance element coupled between a second voltage supply terminal and the second voltage supply node.

The first voltage supply terminal may supply a high voltage having a constant voltage level during the data output enable period and the data output disable period, and the second voltage supply terminal may supply a low voltage having a constant voltage level during the data output enable period and the data output disable period, wherein at least one of the first and second variable resistance elements may have a first resistance value during the data output enable period and has a second resistance value larger than the first resistance value, during the data output disable period.

The transmission circuit may include: a first current path coupled between the first and second voltage supply nodes; and a second current path coupled between the first and second voltage supply nodes.

A resistance value of the current path may be smaller than a resistance value of the first current path and a resistance value reflected in the second current path, during the data output disable period.

The first current path may include first Josephson junctions coupled in series between the first and second voltage supply nodes and first resistance elements, and an input pulse signal corresponding to the data value may be inputted through an input node between the first Josephson junctions and the first resistance element.

The second current path may include second Josephson junctions coupled in series between the first and second voltage supply nodes and a second resistance element, and wherein the output data signal is outputted through an output node between the second Josephson junctions and the second resistance element.

The current path between the first and second voltage supply nodes may be provided to enhance a level of the output terminal to be settled to a reset level.

The semiconductor device may further include: a complementary transmission circuit coupled between a third voltage supply node and a fourth voltage supply node, and suitable for outputting a complementary output data signal corresponding to the data value to the output terminal during the data output enable period; and a complementary switching circuit coupled between the third and fourth voltage supply nodes, and suitable for providing a current path between the third and fourth voltage supply nodes during a data output disable period.

In accordance with an embodiment, a transmitter includes: a transmission circuit configured to output an output data signal to an output terminal in a superconducting state or a voltage state depending on a data value, during a data output enable period; and a variable resistance element coupled to at least one of first and second supply voltage terminals of the transmission circuit, and configured to have a first resistance value to allow at least a supply voltage having a constant voltage level to be supplied to the transmission circuit during the data output enable period, and a second resistance value to block supplying of the supply voltage to the transmission circuit during a data output disable period.

The transmission circuit may include: a first current path including first Josephson junctions and a first resistance element coupled in series; and a second current path including second Josephson junctions and a second resistance element coupled in series.

The variable resistance element may include: a MOS transistor configured to be controlled in response to an output control signal which is activated during the data output enable period and deactivated during the data output disable period.

In accordance with an embodiment, a transmitter includes:

A transmitter comprising: a transmission circuit configured to output an output data signal to an output terminal in a superconducting state or a voltage state depending on a data value, during a data output enable period; a variable resistance element coupled to at least one of first and second supply voltage terminals, and configured to have a first resistance value to allow at least a supply voltage having constant voltage level to be supplied to the transmission circuit during the data output enable period, and a second resistance value to block supplying of the supply voltage to the transmission circuit during a data output disable period; and a switching circuit configured to selectively provide an additional current path across the transmission circuit during the data output disable period.

The transmission circuit may include: a first current path including first Josephson junctions and a first resistance element coupled in series; and a second current path including second Josephson junctions and a second resistance element coupled in series.

The variable resistance element may include: a MOS transistor configured to be controlled in response to an output control signal which is activated during the data output enable period and deactivated during the data output disable period.

The switching circuit may include: a MOS transistor configured to be controlled in response to a switching control signal which is activated during the data output disable period and deactivated during the data output enable period.

DETAILED DESCRIPTION

Figure 1:
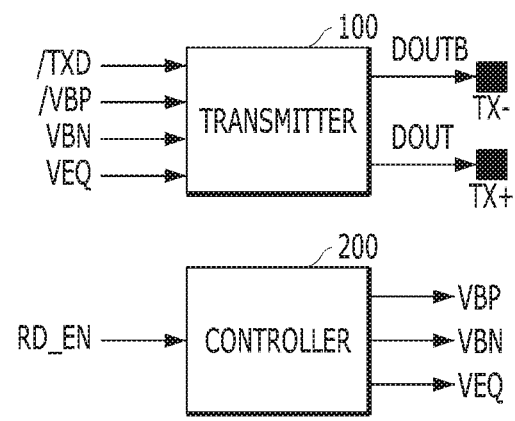
FIG. 1 is a block diagram illustrating a semiconductor device in accordance with an embodiment of the present invention.

Various embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art.

Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or it is clear from the context to be directed to a singular form.

FIG. 1 is a block diagram illustrating a semiconductor device in accordance with an embodiment of the present invention.

Referring to FIG. 1, the semiconductor device may include a transmitter 100 and a controller 200.

The transmitter 100 may output differential output data signals DOUT and DOUTB corresponding to an input pulse signal /TXD to an external device (e.g., a warmer domain device; not shown) through first and second pads (i.e., output terminals) TX+ and TX−. For example, the transmitter 100 may output the differential output data signals DOUT and DOUTB corresponding to 1-bit data within a bit interval AA, in response to first and second output control signals /VBP and VBN and a switching control signal VEQ. At this time, the transmitter 100 may generate the differential output data signals DOUT and DOUTB corresponding to the input pulse signal /TXD during a data output enable period BB of the bit interval AA. During the data output enable period BB, the differential output data signals DOUT and DOUTB may have inversion levels. The differential output data signals DOUT and DOUTB may have a reset level during a data output disable period CC.

The input pulse signal /TXD may indicate a value of a data signal to be transmitted (i.e., a data value). For example, when the data value is '0', the input pulse signal /TXD maintains a low voltage level (e.g., a ground voltage GND level) during the data output enable period BB. On the other hand, when the data value is '1', the input pulse signal /TXD pulses for a short time within the data output enable period BB.

The controller 200 may generate the first and second output control signals /VBP and VBN and the switching control signal VEQ based on a transmission enable signal RD_EN. The first and second output control signals /VBP and VBN may be activated during the data output enable period BB and deactivated during the data output disable period CC. Alternatively, the first output control signal /VBP may be activated during the data output enable period BB and deactivated during the data output disable period CC, and the second output control signal VBN may be deactivated during the data output enable period BB and the data output disable period CC. Alternatively, the first output control signal /VBP may be deactivated during the data output enable period BB and the data output disable period CC, and the second output control signal VBN may be activated during the data output enable period BB and deactivated during the data output disable period CC.

The bit interval AA may be time required for transmitting a 1-bit data signal. The bit interval AA may include the data output enable period BB and the data output disable period CC. The data output enable period BB may include a minimum amount of time required for a receiver (not illustrated) to receive the 1-bit data signal, i.e., a receive window. The data output disable period CC may include time required for resetting Josephson junctions, which is to be described below. The data output period BB and the data non-output period CC may be continuous to each other. When a plurality of bit intervals AA continuously occur, the data output enable period BB and the data output disable period CC may repeatedly occur (refer to FIG. 3).

Figure 2:
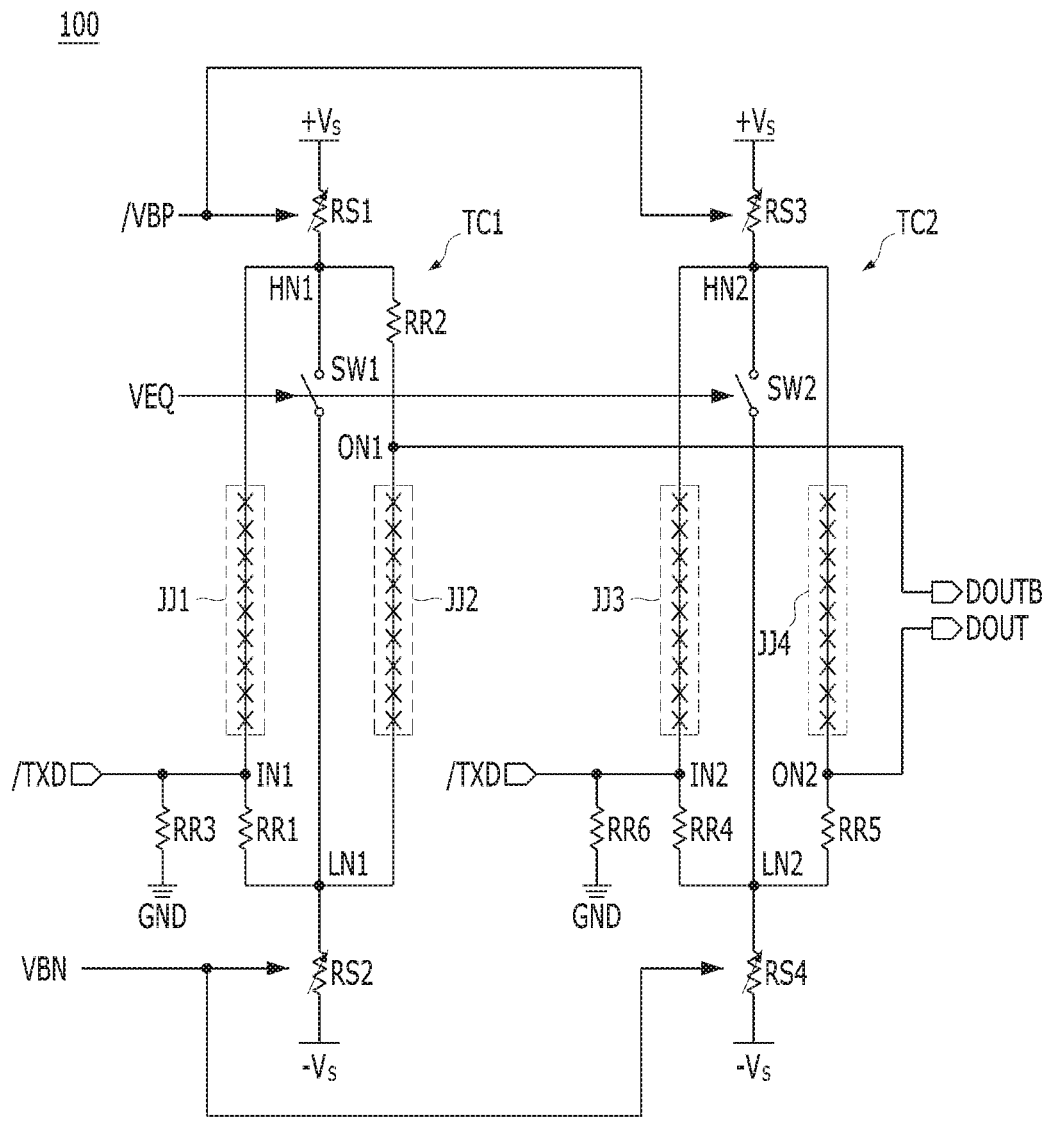
FIG. 2 is a detailed diagram of a transmitter shown in FIG. 1.

FIG. 2 is a circuit diagram of the transmitter 100 shown in FIG. 1.

Referring to FIG. 2, the transmitter 100 may include a first variable resistance element RS1, a second variable resistance element RS2, a first transmission circuit TC1, a first switching circuit SW1, a third variable resistance element RS3, a fourth variable resistance element RS4, a second transmission circuit TC2 and a second switching circuit SW2. The second transmission circuit TC2 is a complementary transmission circuit of the first transmission circuit TC1.

The first variable resistance element RS1 may be coupled between a high voltage +Vs supply terminal and a first high voltage supply node HN1. The first variable resistance element RS1 may serve as a header current source (i.e., a sourcing current source). For example, the first variable resistance element RS1 may include a first PMOS transistor. The first variable resistance element RS1 may have a first resistance value during the data output enable period BB and have a second resistance value larger than the first resistance value during the data output disable period CC, in response to the first output control signal /VBP. For example, the first PMOS transistor may be turned on during the data output enable period BB and turned off during the data output disable period CC, in response to the first output control signal /VBP. The first variable resistance element RS1 may have the first resistance value during the data output enable period BB and the data output disable period CC in response to the first output control signal /VBP. For example, the first PMOS transistor may be turned on during the data output enable period BB and the data output disable period CC in response to the first output control signal /VBP.

The second variable resistance element RS2 may be coupled between a low voltage −Vs supply terminal and a first low voltage supply node LN1. The second variable resistance element RS2 may serve as a tail current source (i.e., a sinking current source). For example, the second variable resistance element RS2 may include a first NMOS transistor. The second variable resistance element RS2 may have the first resistance value during the data output enable period BB and have the second resistance value during the data output disable period CC, in response to the second output control signal VBN. For example, the first NMOS transistor may be turned on during the data output enable period BB and turned off during the data output disable period CC, in response to the second output control signal VBN. Alternatively, the second variable resistance element RS2 may have the first resistance value during the data output enable period BB and the data output disable period CC in response to the second output control signal VBN. For example, the first NMOS transistor may be turned on during the data output enable period BB and the data output disable period CC in response to the second output control signal VBN.

The high voltage +Vs supply terminal may supply a high voltage having a constant voltage level, for example, a positive voltage, during the data output enable period BB and the data output disable period CC. The low voltage −Vs supply terminal may supply a low voltage having a constant voltage level, for example, a negative voltage, during the data output enable period BB and the data output disable period CC.

The first transmission circuit TC1 may be coupled between the first high voltage supply node HN1 and the first low voltage supply node LN1. The first transmission circuit TC1 may generate the output data bar signal (i.e., complementary output data signal) DOUTB of the differential output data signals DOUT and DOUTB corresponding to the input pulse signal /TXD during the data output enable period BB. The first transmission circuit TC1 may include a first input current path and a first output current path.

The first input current path may be coupled between the first high voltage supply node HN1 and the first low voltage supply node LN1. The first input current path may include first Josephson junctions JJ1 and a first resistance element RR1. The first Josephson junctions JJ1 may be coupled in series between the first high voltage supply node HN1 and a first input node IN1. The first input node IN1 may be a node to which the input pulse signal /TXD is inputted. A third resistance element RR3 may be coupled between the first input node IN1 and a ground voltage terminal GND. The first resistance element RR1 may be coupled between the first input node IN1 and the first low voltage supply node LN1.

For reference, Josephson junctions may have a superconducting state (State X) or a voltage state (State Y) depending on the magnitude of a current flowing therethrough. The superconducting state (State X) refers to a state where a resistance value of the Josephson junctions is substantially 'zero' when a current equal to or less than a threshold value flows through the Josephson junctions, and the voltage state (State Y) refers to a state where the resistance value of the Josephson junctions is 'nonzero' when a current greater than the threshold value flows through the Josephson junctions.

The first output current path may be coupled between the first high voltage supply node HN1 and the first low voltage supply node LN1. The first output current path may include a second resistance element RR2 and a second Josephson junctions JJ2. The second resistance element RR2 may be coupled between the first high voltage supply node HN1 and a first output node ON1. The first output node ON1 may be a node through which the output data bar signal DOUTB is outputted. The second Josephson junctions JJ2 may be coupled in series between the first output node ON1 and the first low voltage supply node LN1.

The first coupling circuit SW1 may be coupled between the first high voltage supply node HN1 and the first low voltage supply node LN1. The first coupling circuit SW1 may not provide a first additional current path during the data output enable period BB but provide the first additional current path between the first high voltage supply node HN1 and the first low voltage supply node LN1 during the data output disable period CC. For example, the first switching circuit SW1 may include a first switching element (e.g., an NMOS transistor). The first switching element may electrically separate the first high voltage supply node HN1 from the first low voltage supply node LN1 during the data output enable period BB, and electrically couple the first high voltage supply node HN1 to the first low voltage supply node LN1 during the data output disable period CC, in response to the switching control signal VEQ.

Desirably, the resistance value of the first additional current path may be designed to be smaller than the resistance value of the first input current path and the resistance value of the first output current path, in particular, during the data output disable period CC.

The third variable resistance element RS3 may be coupled between the high voltage +Vs supply terminal and a second high voltage supply node HN2. The third variable resistance element RS3 may serve as a header current source. For example, the third variable resistance element RS3 may include a second PMOS transistor. The third variable resistance element RS3 may have the first resistance value during the data output enable period BB and have the second resistance value during the data output disable period CC, in response to the first output control signal /VBP. For example, the second PMOS transistor may be turned on during the data output enable period BB and turned off during the data output disable period CC, in response to the first output control signal /VBP. Alternatively, the third variable resistance element RS3 may have the first resistance value during the data output enable period BB and the data output disable period CC in response to the first output control signal /VBP. For example, the second PMOS transistor may be turned on during the data output enable period BB and the data output disable period CC in response to the first output control signal /VBP.

The fourth variable resistance element RS4 may be coupled between the low voltage −Vs supply terminal and a second low voltage supply node LN2. The fourth variable resistance element RS4 may serve as a tail current source. For example, the fourth variable resistance element RS4 may include a second NMOS transistor. The fourth variable resistance element RS4 may have the first resistance value during the data output enable period BB and have the second resistance value during the data output disable period CC, in response to the second output control signal VBN. For example, the second NMOS transistor may be turned on during the data output enable period BB and turned off during the data output disable period CC, in response to the second output control signal VBN. Alternatively, the fourth variable resistance element RS4 may have the first resistance value during the data output enable period BB and the data output disable period CC in response to the second output control signal VBN. For example, the second NMOS transistor may be turned on during the data output enable period BB and the data output disable period CC in response to the second output control signal VBN.

The second transmission circuit TC2 may be coupled between the second high voltage supply node HN2 and the second low voltage supply node LN2. The second transmission circuit TC2 may generate the output data signal DOUT of the differential output data signals DOUT and DOUTB corresponding to the input pulse signal /TXD during the data output enable period BB. The second transmission circuit TC2 may include a second input current path and a second output current path.

The second input current path may be coupled between the second high voltage supply node HN2 and the second low voltage supply node LN2. The second input current path may include third Josephson junctions JJ3 and a fourth resistance element RR4. The third Josephson junctions JJ3 may be coupled in series between the second high voltage supply node HN2 and a second input node IN2. The second input node IN2 may be a node to which the input pulse signal /TXD is inputted. A third resistance element RR6 may be coupled between the second input node IN2 and the ground voltage terminal GND. The fourth resistance element RR4 may be coupled between the second input node IN2 and the second low voltage supply node LN2. The second output current path may be coupled between the second high voltage supply node HN2 and the second low voltage supply node LN2. The second output current path may include fourth Josephson junctions JJ4 and a fifth resistance element RR5. The fourth Josephson junctions JJ4 may be coupled in series between the second high voltage supply node HN2 and a second output node ON2. The second output node ON2 may be a node through which the output data signal DOUT is outputted. The fifth resistance element RR5 may be coupled between the second output node ON2 and the second low voltage supply node LN2. For example, each of the resistance elements RR1, RR2, RR3, RR4, RR5 and RR6 may be embodied with a resistor.

The second switching circuit SW2 may be coupled between the second high voltage supply node HN2 and the second low voltage supply node LN2. The second switching circuit SW2 may not provide a second additional current path between the second high voltage supply node HN2 and the second low voltage supply node LN2 during the data output enable period BB, but provide the second additional current path between the second high voltage supply node HN2 and the second low voltage supply node LN2 during the data output disable period CC. For example, the second switching circuit SW2 may include a second switching element (e.g., an NMOS transistor). The second switching element may electrically separate the second high voltage supply node HN2 from the second low voltage supply node LN2 during the data output enable period BB, and electrically couple the second high voltage supply node HN2 to the second low voltage supply node LN2 during the data output disable period CC, in response to the switching control signal VEQ.

Desirably, the resistance value of the second additional current path may be designed to be smaller than the resistance value of the second input current path and the resistance value of the second output current path, in particular, during the data output disable period CC.

Hereinafter, an operation of the semiconductor device having the above-described structure will be described with reference to FIGS. 3 to 6.

Figure 3:
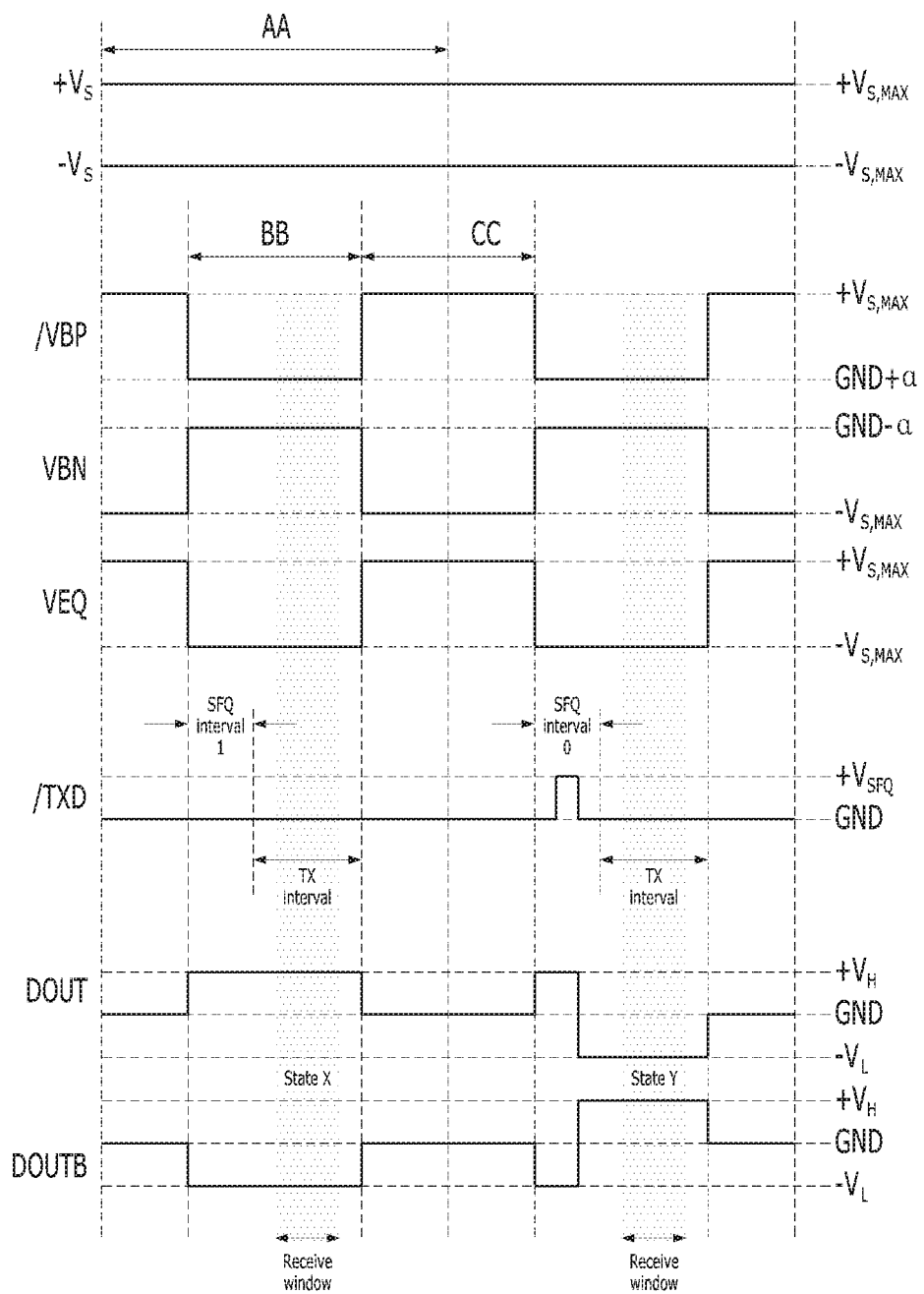
FIGS. 3 and 4 are timing diagrams for describing an example of an operation of the semiconductor device shown in FIG. 1.

FIG. 3 is a timing diagram for describing an example of an operation of the semiconductor device in accordance with the present embodiment.

Referring to FIG. 3, a transmission operation may be performed in a state where a high voltage +Vs and a low voltage −Vs are supplied at a constant level.

The controller 200 may generate the first and second output control signals /VBP and VBN and the switching control signal VEQ according to the bit interval AA based on a transmission enable signal RD_EN. For example, the first and second output control signals /VBP and VBN may be activated during the data output enable period BB and deactivated during the data output disable period CC. On the contrary, the switching control signal VEQ may be deactivated during the data output enable period BB and activated during the data output disable period CC. The first output control signal /VBP may swing between a first voltage GND+α and the high voltage +Vs. In the first voltage GND+a, 'a' may be set in consideration of a threshold voltage of the first variable resistance element RS1 and a threshold voltage of the third variable resistance element RS3. The second output control signal VBN may swing between the low voltage −Vs and a second voltage GND-α. In the second voltage GND-α, 'α' may be set in consideration of a threshold voltage of the second variable resistance element RS2 and a threshold voltage of the fourth variable resistance element RS4. The switching control signal VEQ may swing between the low voltage −Vs and the high voltage +Vs.

When the input pulse signal /TXD maintains a constant level during the data output enable period BB (specifically, during a SFQ interval 1 of the data output enable period BB), the transmitter 100 may determine that a data value of the data signal to be transmitted is '1', and output the differential output data signals DOUT and DOUTB corresponding to the data value of '1' through first and second pads TX+ and TX− during the data output enable period BB (specifically, during a TX interval of the data output enable period BB). For example, the first to fourth Josephson junctions JJ1 to JJ4 included in the transmitter 100 may have the superconducting state (State X) during the data output enable period BB, thereby generating the differential output data signals DOUT and DOUTB corresponding to the data value of '1'.

When the input pulse signal /TXD pulses during the data output enable period BB (specifically, during a SFQ interval 0 of the data output enable period BB), the transmitter 100 may determine that the data value of the data signal to be transmitted is '0', and output the differential output data signals DOUT and DOUTB corresponding to the data value of '0' through the first and second pads TX+ and TX− during the data output enable period BB (specifically, during a TX interval of the data output enable period BB). For example, the first to fourth Josephson junctions JJ1 to JJ4 included in the transmitter 100 may have the voltage state (State Y) during the data output enable period BB, thereby generating the differential output data signals DOUT and DOUTB corresponding to the data value of '0'. In the figure, '+$V_{SFQ}$' denotes a magnitude of a pulse of the input pulse signal /TXD; '+$V_H$' and '−$V_L$' denote magnitudes of the output data signals DOUT corresponding to a data value '1' and '0'; and '+$V_{S,MAX}$' and '−$V_{S,MAX}$' denote maximum levels of the high voltage +Vs and the low voltage −Vs.

On the other hand, the first to fourth Josephson junctions JJ1 to JJ4 included in the first and second transmission circuits TC1 and TC2 may be reset to the superconducting state (State X) during the data output disable period CC. For example, as the first and second variable resistance elements RS1 and RS2 are turned off, a current equal to or smaller than the threshold value flows through the first input current path and the first output current path, during the data output disable period CC. Similarly, as the third and fourth variable resistance elements RS3 and RS4 are turned off, a current equal to or smaller than the threshold value flows through the second input current path and the second output current path, during the data output disable period CC. Accordingly, the first to fourth Josephson junctions JJ1 to JJ4 may be reset to the superconducting state (State X). More precisely, when the first to fourth Josephson junctions JJ1 to JJ4 are in the superconducting state (State X) during the data output enable period BB, they may maintain the superconducting state (State X) during the data output disable period CC. On the other hand, when the first to fourth Josephson junctions JJ1 to JJ4 are in the voltage state (State Y) during the data output enable period BB, they may be reset to the superconducting state (State X) during the data output disable period CC. Therefore, the first and second transmission circuits TC1 and TC2 may generate the differential output data signals DOUT and DOUTB at a reset level, for example, a ground voltage GND, during the data output disable period CC.

During the data output disable period CC, the first and second switching circuits SW1 and SW2 provide the first and second additional current paths to the first and second transmission circuits TC1 and TC2, respectively, and thus improve the speed of the reset operation of the second transmission circuits TC1 and TC2. In other words, when the first and second transmission circuits TC1 and TC2 generate the differential output data signals DOUT and DOUTB having the reset level during the data output disable period CC, the first and second current additional paths are additionally provided to the first and second transmission circuits TC1 and TC2, respectively, thereby rapidly settling the voltage levels of the differential output data signals DOUT and DOUTB to the reset level. This process will be described in more detail with reference to FIG. 4.

Figure 4:
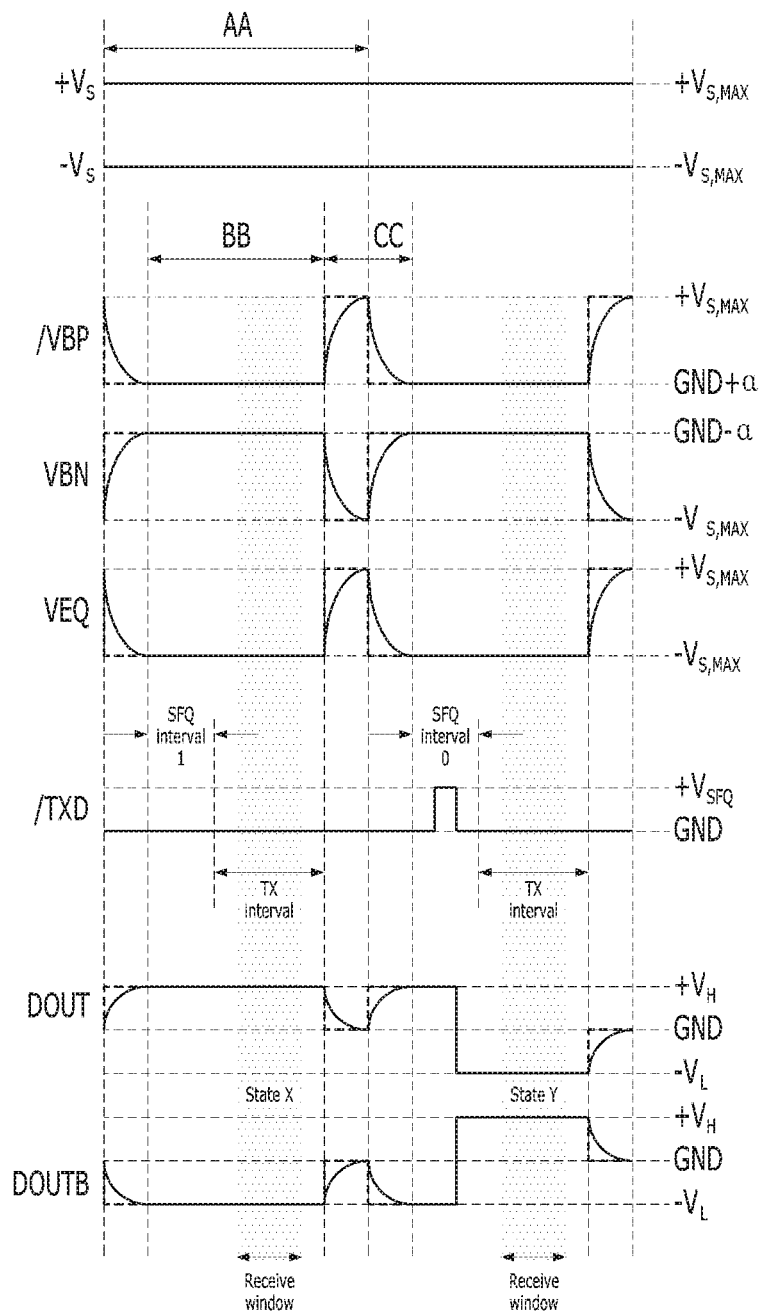

FIG. 4 is a timing diagram for additionally describing the operation of the semiconductor device in FIG. 3. That is, FIG. 3 is an ideal timing diagram, whereas FIG. 4 is an actual timing diagram.

FIG. 4 shows that the voltage levels of the differential output data signals DOUT and DOUTB are rapidly settled to the reset level during the data output disable period CC. Detailed descriptions thereof are as follows.

During the data output disable period CC, the first switching circuit SW1 may provide the first additional current path between the first high voltage supply node HN1 and the first low voltage supply node LN1 of the first transmission circuit TC1, and the second switching circuit SW2 may provide the second additional current path between the second high voltage supply node HN2 and the second low voltage supply node LN2 of the second transmission circuit TC2. Although the first high voltage supply node HN1 and the first low voltage supply node LN1 are electrically separated from the high voltage +Vs supply terminal and the low voltage −Vs supply terminal, respectively, during the data output disable period CC, the first high voltage supply node HN1 may maintain a high voltage +Vs level by its parasitic capacitor, and the first low voltage supply node LN2 may maintain a low voltage −Vs level by its parasitic capacitor. Accordingly, as charge sharing occurs between the first high voltage supply node HN1 and the first low voltage supply node LN1 through the first additional current path, the first high voltage supply node HN1 and the first low voltage supply node LN1 may be rapidly settled to a level halfway between the high voltage +Vs level and the low voltage −Vs level, that is, the reset level. Similarly, although the second high voltage supply node HN2 and the second low voltage supply node LN2 are electrically separated from the high voltage +Vs supply terminal and the low voltage −Vs supply terminal, respectively, during the data output disable period CC, the second high voltage supply node HN2 may maintain the high voltage +Vs level by its parasitic capacitor, and the second low voltage supply node LN2 may maintain the low voltage −Vs level by its parasitic capacitor. Accordingly, as charge sharing occurs between the second high voltage supply node HN2 and the second low voltage supply node LN2 through the second additional current path, the second high voltage supply node HN2 and the second low voltage supply node LN2 may be rapidly settled to the level halfway between the high voltage +Vs level and the low voltage −Vs level, that is, the reset level.

Consequently, it is possible to reduce the data output disable period CC and the bit interval AA.

Figure 5:
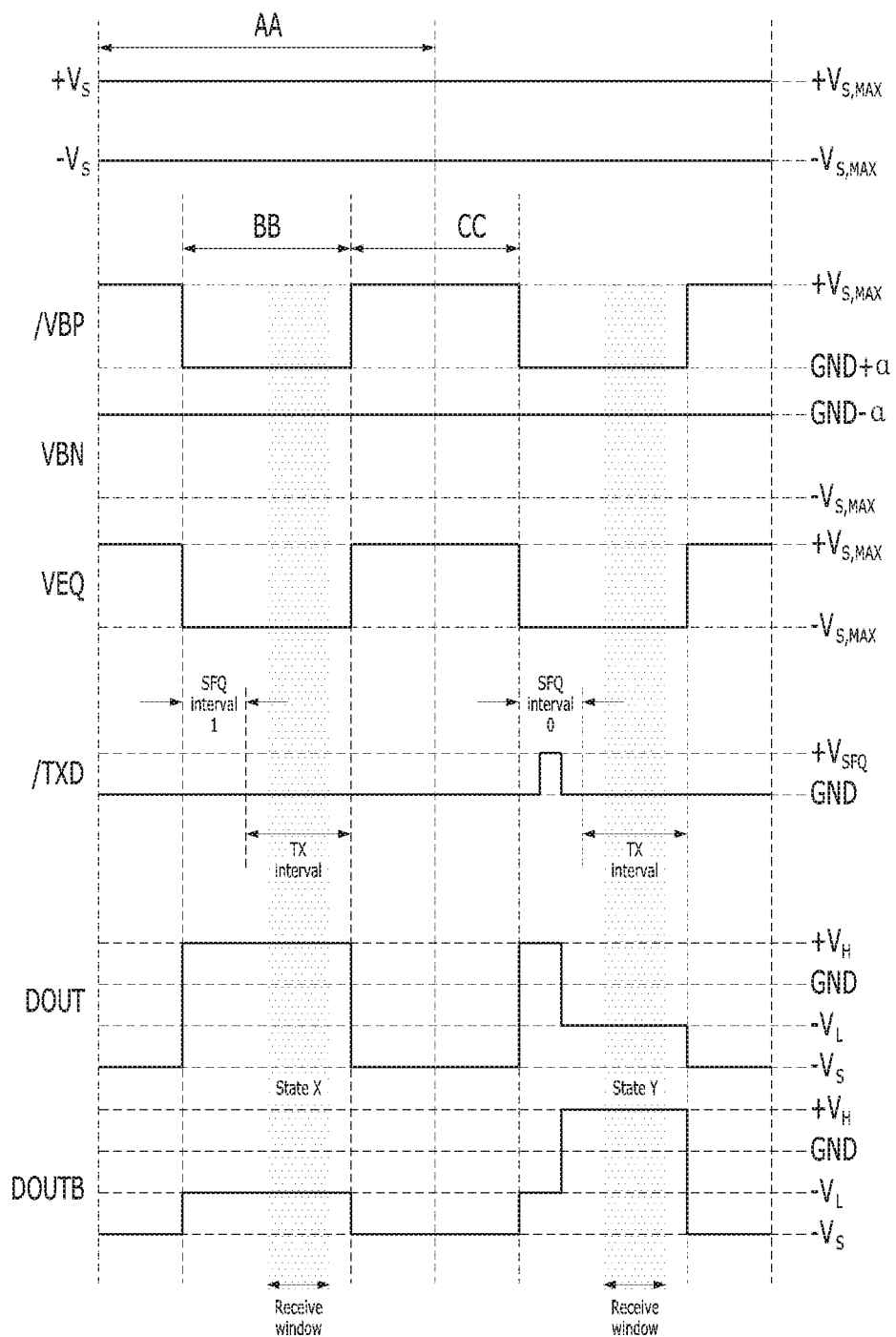
FIG. 5 is a timing diagram for describing another example of the operation of the semiconductor device shown in FIG. 1.
Figure 6:
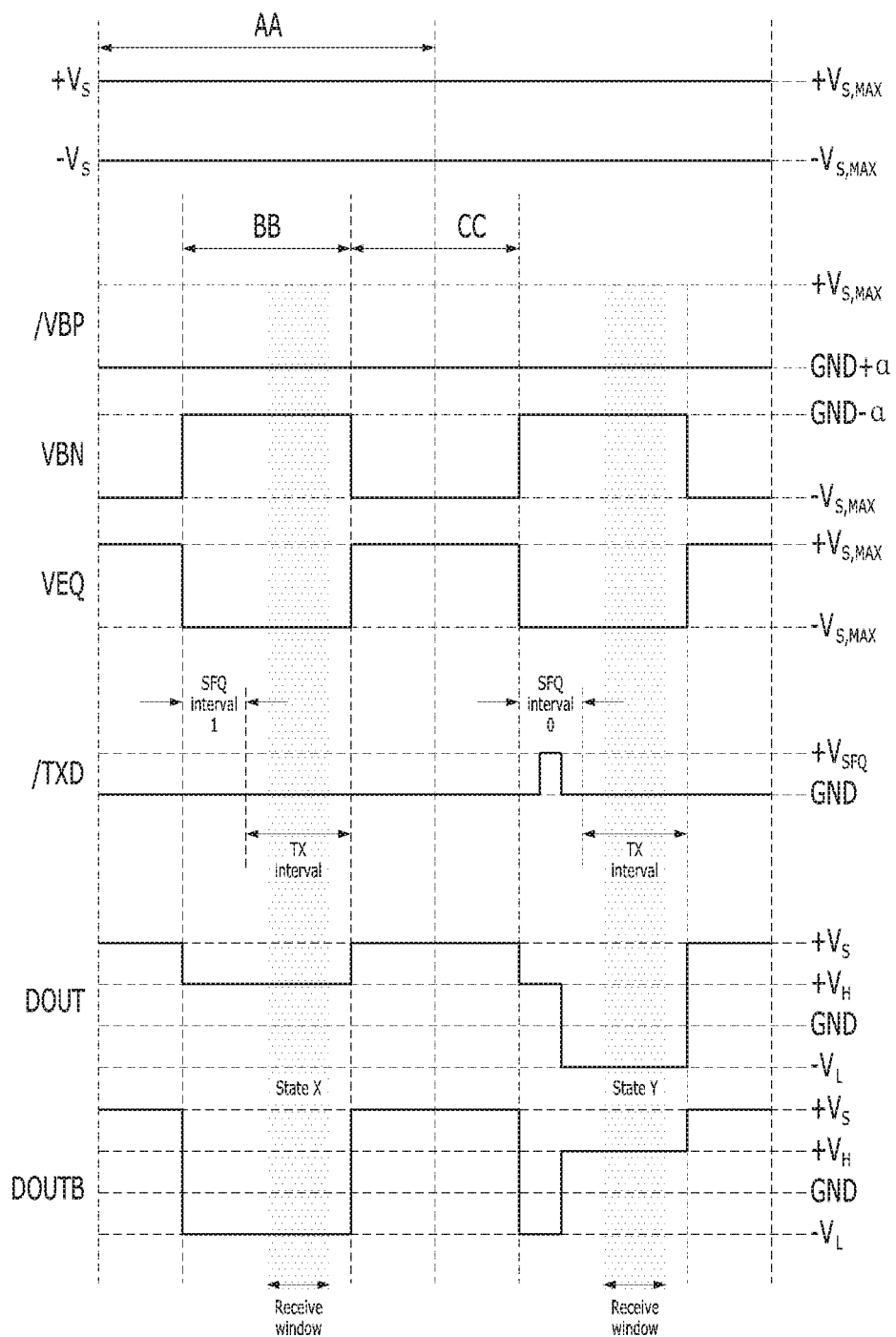
FIG. 6 is a timing diagram for describing yet another example of the operation of the semiconductor device shown in FIG. 1.

FIGS. 5 and 6 are timing diagrams for describing another example of the operation of the semiconductor device shown in FIG. 1. FIGS. 5 and 6 are characterized in that only any one group of elements between the first and third variable resistance elements RS1 and RS3 and the second and fourth variable resistance elements RS2 and RS4 included in the transmitter 100 are controlled for each period, compared with FIG. 3.

In other words, in FIG. 5, the first and third variable resistance elements RS1 and RS3 are variably controlled depending on each period, and the second and fourth variable resistance elements RS2 and RS4 are uniformly controlled regardless of each period. Accordingly, the first and third variable resistance elements RS1 and RS3 may have the first resistance value during the data output enable period BB, and have the second resistance value larger than the first resistance value during the data output disable period CC. The second and fourth variable resistance elements RS2 and RS4 may have the first resistance value during the data output enable period BB and the data output disable period CC. On the contrary, in FIG. 6, the first and third variable resistance elements RS1 and RS3 are uniformly controlled regardless of each period, and the second and fourth variable resistance elements RS2 and RS4 are variably controlled depending on each period. Accordingly, the first and third variable resistance elements RS1 and RS3 may have the first resistance value during the data output enable period BB and the data output disable period CC. The second and fourth variable resistance elements RS2 and RS4 may have the first resistance value during the data output enable period BB, and have the second resistance value during the data output disable period CC.

Since the operations of FIGS. 5 and 6 are almost similar to those of FIG. 3, detailed descriptions thereof are omitted. In FIG. 5, however, the second output control signal VBN may be continuously activated during the data output enable period BB and the data output disable period CC. Accordingly, the differential output data signals DOUT and DOUTB may have a reset level corresponding to the low voltage −Vs level during the data output disable period CC. In FIG. 6, the first output control signal /VBP may be continuously activated during the data output enable period BB and the data output disable period CC. Accordingly, the differential output data signals DOUT and DOUTB may have a reset level corresponding to the high voltage +Vs level during the data output disable period CC.

Even when the variable resistance elements are controlled as illustrated in FIGS. 5 and 6, the first and second switching circuits SW1 and SW2 provide the first and second additional current paths to the first and second transmission circuits TC1 and TC2, respectively, during the data output disable period CC, thereby improving the speed of the reset operation of the first and second transmission circuits TC1 and TC2. In other words, when the first and second transmission circuits TC1 and TC2 generate the differential output data signals DOUT and DOUTB having the reset level during the data output disable period CC, the first and second current additional paths are additionally provided to the first and second transmission circuits TC1 and TC2, respectively, so that the voltage levels of the differential output data signals DOUT and DOUTB may be rapidly settled to the reset level.

Consequently, it is possible to reduce the data output disable period CC and the bit interval AA.

In accordance with the embodiments, the semiconductor device can minimize the time or period required for the transmission operation by reducing the bit interval, and can minimize power consumption by changing a resistance value while constantly maintaining a voltage level when adjusting the magnitude of a current.

As is apparent from the above descriptions, the semiconductor device in accordance with the embodiment can transmit signals at low power and high speed.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims. For example, although a transmitter is described as a differential type, the present invention may apply to a single ended transmitter.

What is claimed is:

1. A semiconductor device comprising:
   a transmission circuit coupled between a first voltage supply node and a second voltage supply node, and suitable for outputting an output data signal corresponding to a data value to an output terminal during a data output enable period; and
   a switching circuit coupled between the first and second voltage supply nodes, and suitable for providing a current path between the first and second voltage supply nodes during a data output disable period, wherein the current path between the first and second voltage supply nodes is not provided during the data output enable period.

2. The semiconductor device of claim 1, wherein the switching circuit electrically separates the first voltage supply node from the second voltage supply node during the data output enable period, and electrically couples the first voltage supply node to the second voltage supply node during the data output disable period.

3. The semiconductor device of claim 1, further comprising:
   a first variable resistance element coupled between a first voltage supply terminal and the first voltage supply node; and
   a second variable resistance element coupled between a second voltage supply terminal and the second voltage supply node.

4. The semiconductor device of claim 3,
   wherein the first voltage supply terminal supplies a high voltage having a constant voltage level during the data output enable period and the data output disable period,
   wherein the second voltage supply terminal supplies a low voltage having a constant voltage level during the data output enable period and the data output disable period,
   wherein at least one of the first and second variable resistance elements has a first resistance value during the data output enable period and has a second resistance value larger than the first resistance value, during the data output disable period.

5. The semiconductor device of claim 1, wherein the transmission circuit includes:
   a first current path coupled between the first and second voltage supply nodes; and
   a second current path coupled between the first and second voltage supply nodes.

6. The semiconductor device of claim 5, wherein a resistance value of the current path is smaller than a resistance value of the first current path and a resistance value reflected in the second current path, during the data output disable period.

7. The semiconductor device of claim 5, wherein the first current path includes first Josephson junctions coupled in series between the first and second voltage supply nodes and first resistance elements, and wherein an input pulse signal corresponding to the data value is inputted through an input node between the first Josephson junctions and the first resistance element.

8. The semiconductor device of claim 5, wherein the second current path includes second Josephson junctions coupled in series between the first and second voltage supply nodes and a second resistance element, and wherein the output data signal is outputted through an output node between the second Josephson junctions and the second resistance element.

9. The semiconductor device of claim 1, wherein the current path between the first and second voltage supply nodes is provided to enhance a level of the output terminal to be settled to a reset level.

10. The semiconductor device of claim 1, wherein further comprising:

a complementary transmission circuit coupled between a third voltage supply node and a fourth voltage supply node, and suitable for outputting a complementary output data signal corresponding to the data value to the output terminal during the data output enable period; and a complementary switching circuit coupled between the third and fourth voltage supply nodes, and suitable for providing a current path between the third and fourth voltage supply nodes during a data output disable period.

11. A transmitter comprising:

a transmission circuit configured to output an output data signal to an output terminal in a superconducting state or a voltage state depending on a data value, during a data output enable period; and a variable resistance element coupled to at least one of first and second supply voltage terminals of the transmission circuit, and configured to have a first resistance value to allow at least a supply voltage having a constant voltage level to be supplied to the transmission circuit during the data output enable period, and a second resistance value to block supplying of the supply voltage to the transmission circuit during a data output disable period.

12. The transmitter of claim 11, wherein the transmission circuit includes:

a first current path including first Josephson junctions and a first resistance element coupled in series; and a second current path including second Josephson junctions and a second resistance element coupled in series.

13. The transmitter of claim 11, wherein the variable resistance element includes:

a MOS transistor configured to be controlled in response to an output control signal which is activated during the data output enable period and deactivated during the data output disable period.

14. A transmitter comprising:

a transmission circuit configured to output an output data signal to an output terminal in a superconducting state or a voltage state depending on a data value, during a data output enable period;

a variable resistance element coupled to at least one of first and second supply voltage terminals, and configured to have a first resistance value to allow at least a supply voltage having constant voltage level to be supplied to the transmission circuit during the data output enable period, and a second resistance value to block supplying of the supply voltage to the transmission circuit during a data output disable period; and a switching circuit configured to selectively provide an additional current path across the transmission circuit during the data output disable period.

15. The transmitter of claim 14, wherein the transmission circuit includes:

a first current path including first Josephson junctions and a first resistance element coupled in series; and a second current path including second Josephson junctions and a second resistance element coupled in series.

16. The transmitter of claim 14, wherein the variable resistance element includes:

a MOS transistor configured to be controlled in response to an output control signal which is activated during the data output enable period and deactivated during the data output disable period.

17. The transmitter of claim 14, wherein the switching circuit includes:

a MOS transistor configured to be controlled in response to a switching control signal which is activated during the data output disable period and deactivated during the data output enable period.

* * * * *